United States Patent
Chu et al.

(10) Patent No.: US 6,253,835 B1
(45) Date of Patent: Jul. 3, 2001

(54) ISOTHERMAL HEAT SINK WITH CONVERGING, DIVERGING CHANNELS

(75) Inventors: Richard C. Chu, Poughkeepsie; Michael J. Ellsworth, Jr., Lagrangeville; Robert E. Simons, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/502,321

(22) Filed: Feb. 11, 2000

(51) Int. Cl.[7] .................................................. F28F 7/00
(52) U.S. Cl. .................. 165/80.4; 165/185; 165/104.33; 257/714; 361/699; 361/701; 361/702; 174/15.1
(58) Field of Search ............................ 165/80.4, 104.33, 165/170, 185; 257/712, 714, 715, 722; 174/15.1, 16.3; 361/688, 687, 719, 699, 701, 695, 704

(56) References Cited

U.S. PATENT DOCUMENTS

| 3,361,195 | * | 1/1968 | Meyerhoff et al. | 165/80.4 |
|---|---|---|---|---|
| 5,099,311 | | 3/1992 | Bonde et al. | 357/82 |
| 5,099,910 | | 3/1992 | Walpole et al. | 165/80.4 |
| 5,239,200 | | 8/1993 | Messina et al. | 257/714 |
| 5,309,319 | * | 5/1994 | Messina | 361/699 |
| 5,365,749 | | 11/1994 | Porter | 62/259.2 |
| 5,388,635 | * | 2/1995 | Gruber et al. | 165/80.4 |
| 5,574,627 | | 11/1996 | Porter | 361/719 |
| 5,823,249 | | 10/1998 | Batchelder | 165/121 |
| 6,101,715 | * | 8/2000 | Fuesser et al. | 257/712 |
| 6,164,368 | * | 12/2000 | Furukawa et al. | 165/104.33 |

FOREIGN PATENT DOCUMENTS 7247902    9/1995  (JP) .

* cited by examiner

Primary Examiner—Ira S. Lazarus
Assistant Examiner—Terrell McKinnon
(74) Attorney, Agent, or Firm—Lily Neff, Esq.; Andrew J. Wojnicki, Jr., Esq.; Heslin & Rothenberg, P.C.

(57) ABSTRACT

Apparatus for cooling an electronic device, and a resultant fluid-cooled electronic apparatus are provided. In one embodiment, the apparatus includes a heat sink member with a surface for making thermal contact with the electronic device. The heat sink member has a plurality of channels for carrying coolant fluid. The plurality of channels are positioned in a first group and a second group such that coolant flow alternates across the member. At least one channel of the plurality of channels has a fluid flow cross-section that varies over a length thereof to selectively enhance a heat transfer coefficient of the coolant fluid within the channel and thereby produce a more uniform temperature at the surface of the heat sink member when making thermal contact with the electronic device.

12 Claims, 10 Drawing Sheets fig. 1 fig. 1A fig. 2 fig. 3 fig. 3A fig. 4 fig. 4A fig. 5 fig. 5A fig. 5B fig. 6A fig. 6B fig. 7A fig. 7B fig. 8 fig. 8A fig. 9A fig. 9B

ISOTHERMAL HEAT SINK WITH CONVERGING, DIVERGING CHANNELS

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Isothermal Heat Sink With Tiered Cooling Channels," Agonafer et al., Ser No. 09/502,536, co-filed herewith;

"Isothermal Heat Sink With Cross-Flow Openings Between Channels," Chu et al., Ser. No. 09/501,640, co-filed herewith;

"Hybrid Cooling System For Electronics Module," Chrysler et al., Ser. No. 09/338,254, filed Jun. 22, 1999; and "Evaporator For use In An Extended Air Cooling System For Electronic Components," Chu et al., Ser. No. 09/052,416, filed Mar. 31, 1998.

TECHNICAL FIELD

The present invention is generally related to providing cooling systems for electronic devices requiring cooling. More particularly, the present invention is directed to an isothermal heat sink for uniformly cooling an electronics module.

BACKGROUND OF THE INVENTION

In recent years, the semiconductor industry has taken advantage of the fact that CMOS circuits dissipate less power than bipolar circuits. This has permitted more dense packaging and correspondingly, faster CMOS circuits. However, almost no matter how fast one wishes to run a given electronic circuit chip, there is always the possibility of running it faster if the chip is cooled to lower temperatures during operation. This is particularly true of computer processor chips and even more true of these chips when they are disposed within multichip modules (MCMs), which generate significant amounts of heat. Because there is great demand to run processor modules at higher speeds, the corresponding clock frequencies at which these devices must operate become higher. In this regard, it should be noted that it is known that power generation rises in direct proportion to the clock frequency. Accordingly, the desire for faster computers generates not only demand for computer systems but generates thermal demand in terms of energy which must be removed for faster, safer and more reliable circuit operation. In this regard, it is to be particularly noted that, in the long run, thermal energy is the single biggest impediment to semiconductor operation integrity.

Multichannel heat sinks have been developed for extraction of heat generated by, for example, integrated electronic circuits, multi-chip modules, diode laser arrays, or other electro-optic devices under conditions of high heat flux density. Coolant flow in the channels is conventionally unidirectional, i.e., the coolant enters the heat sink through an inlet at one end and flows through parallel channels to an outlet at the other end.

An enhanced heat sink is described in U.S. Pat. No. 5,099,910, entitled "Microchannel Heat Sink With Alternating Flow Directions," the entirety of which is hereby incorporated herein by reference. Briefly summarized, this patent presents a heat sink wherein temperature rise along multiple parallel channels is addressed by providing alternating coolant flow directions through the channels of the heat sink. Although improving heat surface temperature distribution over the uniform flow direction approach, further enhancements are believed desirable to more closely achieve the goal of a truly isothermal heat sink for an electronic device.

DISCLOSURE OF THE INVENTION

Briefly described, the present invention comprises in one aspect an apparatus for cooling an electronic device which includes a heat sink member with a surface for making thermal contact with the electronic device. The heat sink member includes a plurality of channels formed therein for carrying coolant fluid. The plurality of channels comprise a first group of channels and a second group of channels, wherein the first group of channels and the second group of channels are positioned generally alternately across the heat sink member so that coolant flow alternates direction across the member. At least one channel of the first group of channels and the second group of channels has a channel cross-section that varies over a length thereof to enhance a heat transfer coefficient of the coolant fluid within the at least one channel at a selected section of the at least one channel and thereby produce a more uniform temperature at the surface of the heat sink member when making thermal contact with the electronic device. More particularly, at least some channels of the first group of channels and the second group of channels preferably have a fluid flow cross-section which tends to converge near a center portion of the heat sink member and diverge thereafter.

To restate, provided herein are various embodiments for attaining an isothermal heat sink for use in a cooling system of an electronic device. Enhanced performance of the cooling system is attained by more uniformly dissipating heat across the thermal interface surface of the heat sink, thereby more uniformly cooling the electronic device to which the heat sink is coupled. By more uniformly dissipating heat across the thermal interface surface, thermal resistance between the heat sink and electronic device is lowered. Further, since timing (synchronization) and noise tolerances are a function of electronic device temperature, maintaining circuits as isothermal as possible minimizes the temperature effect resulting in improved noise margin and clock skew. This effect is more pronounced in multichip modules.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1:
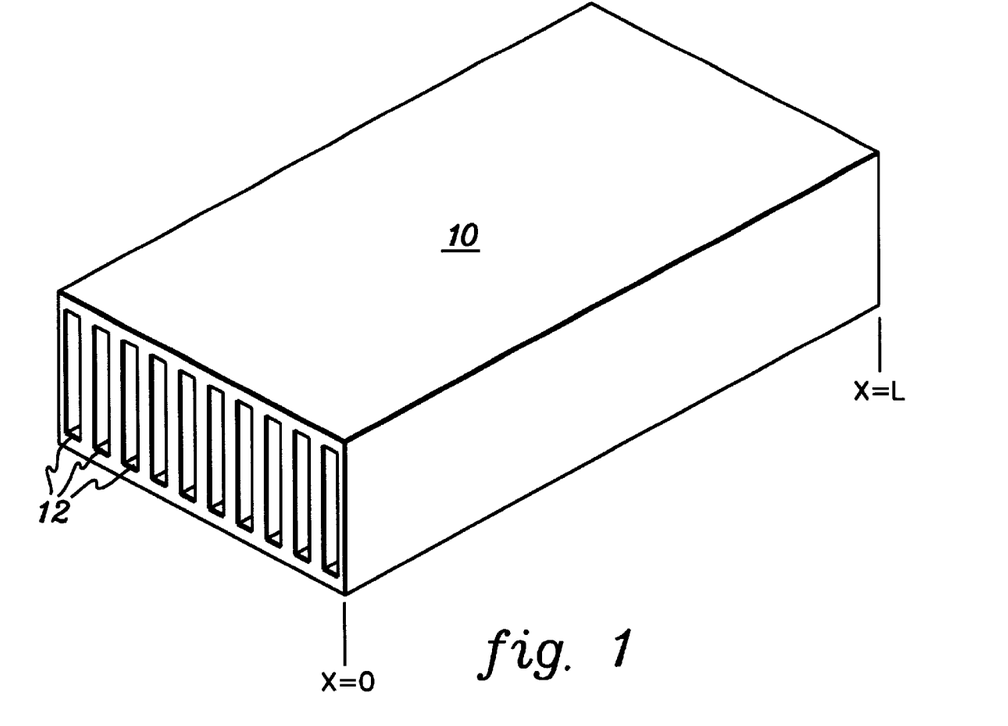
FIG. 1 depicts one embodiment of a heat sink 10 having multiple channels 12 therethrough within which coolant fluid is to flow in accordance with the principles of the present invention.

FIG. 1 depicts one embodiment of a heat sink, generally denoted 10, to employ counter coolant fluid flow in alternating channels in accordance with the principles of the present invention. Heat sink 10 has a plurality of channels 12, each with length L, through which cooling fluid is to be passed. In the elevational view of FIG. 1A, heat sink 10 is shown to have a bottom surface 13 designed to thermally interface with an electronic device 14 (shown in phantom). Ideally, a uniform heat flux is to be established for dissipation by the heat sink.

Figure 2:
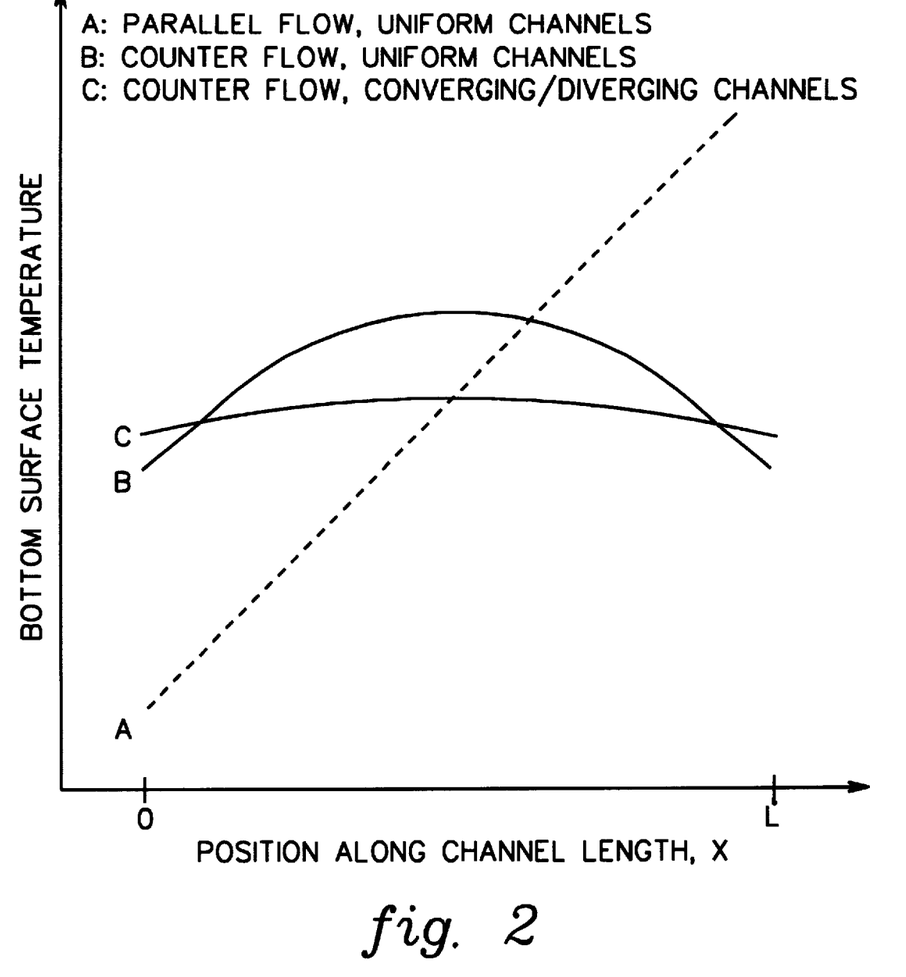
FIG. 2 is a graph showing variation in bottom surface temperature for the heat sink of FIG. 1 using different coolant fluid flow and channel configurations in accordance with the present invention.

FIG. 2 is a graph of thermal effectiveness of various cooling approaches, two of which might employ the heat sink of FIG. 1. Curve A of FIG. 2 represents a conventional, parallel flow of cooling fluid through multiple uniform channels wherein bottom surface temperature of the heat sink increases with distance along the channel length. This curve assumes fluid flow in a direction left to right through the heat sink. A better approach, referred to herein as a counter flow arrangement, is to provide cooling fluid flows in alternate directions in adjacent channels in the heat sink. The thermal characteristics of this approach are represented by curve B in FIG. 2. The goal of the present invention is to provide various cooling apparatus which further enhance, i.e., flatten, thermal variation across the interface of the heat sink compared with the response characteristic of curve B.

Figure 3:
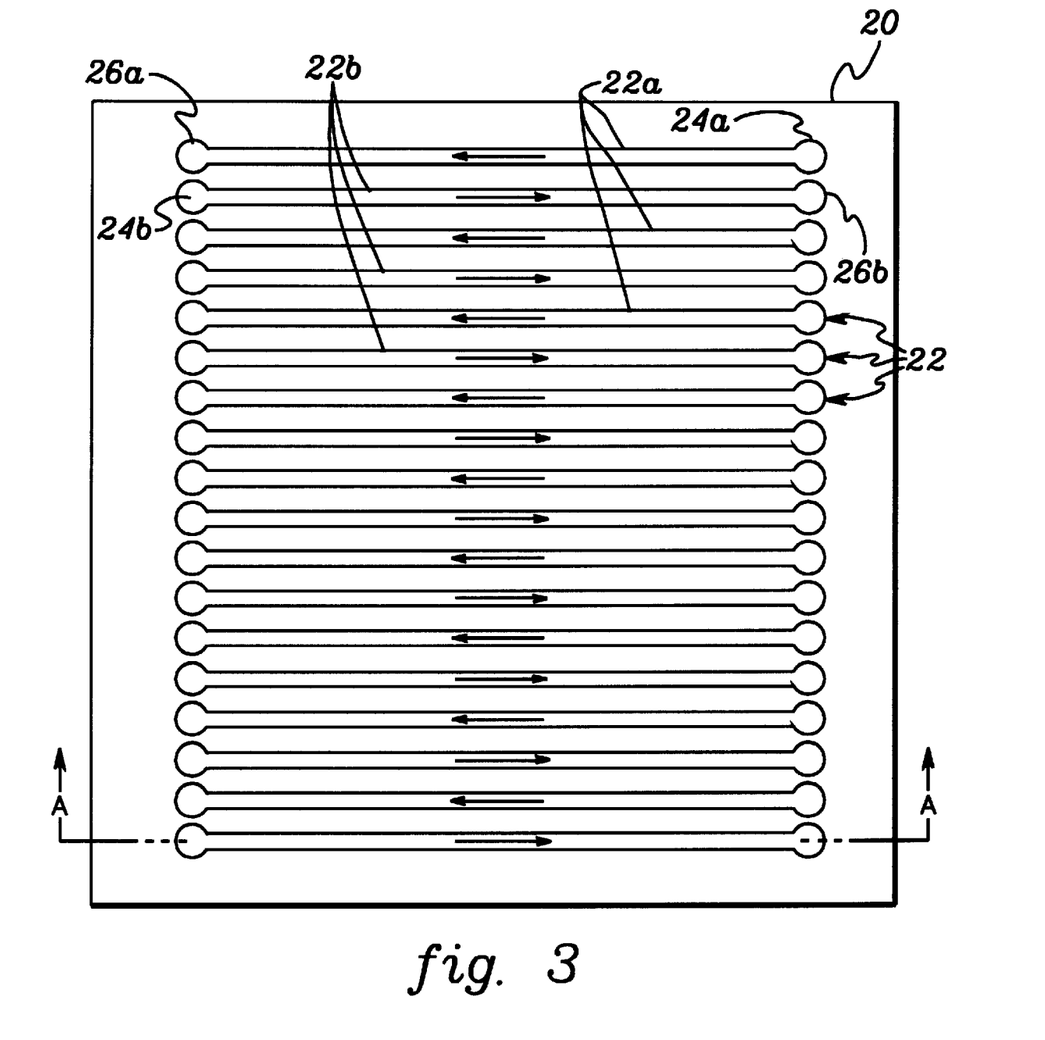
FIG. 3 is a plan view of one embodiment of a heat sink wherein the direction of coolant fluid flow alternates across the heat sink.
Figure 3A:
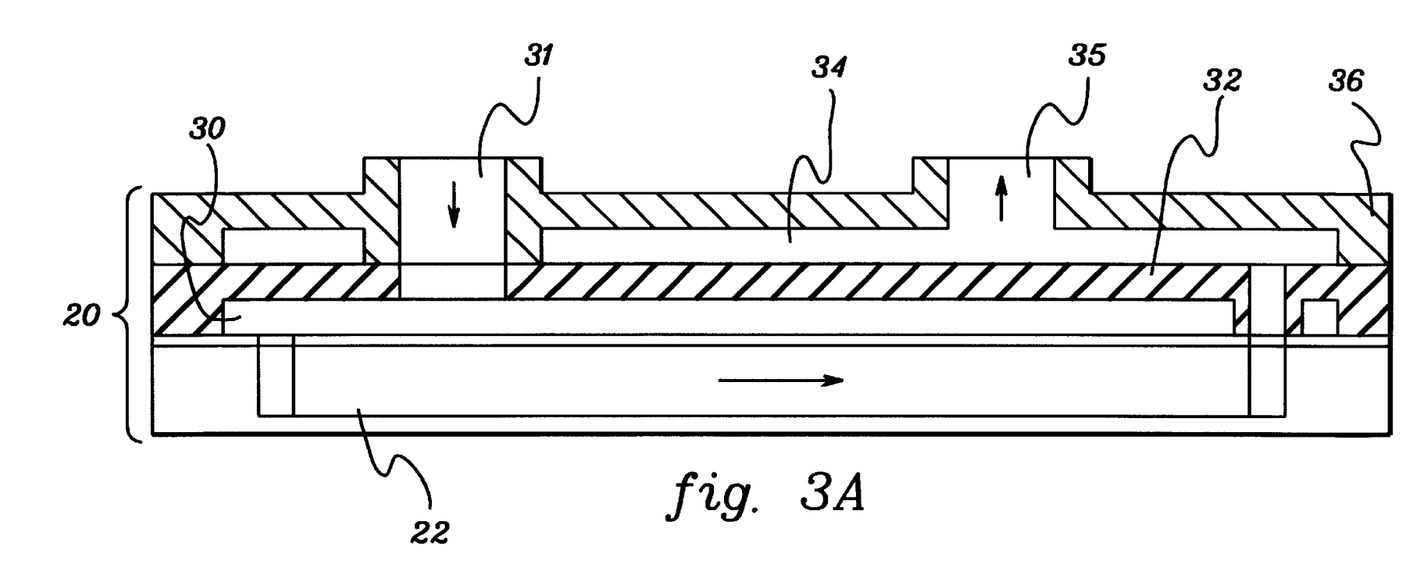
FIG. 3A is a cross-sectional view of the heat sink embodiment of FIG. 3 taken along lines A—A.

FIG. 3 depicts a plan view of a counter flow arrangement to a heat sink 20. As shown, heat sink 20 includes multiple channels 22 which are constructed so that coolant flows right to left in a first group of channels 22a and left to right in a second group of channels 22b. Fluid enters through inlets 24a in channels 22a and exits through outlets 26a, and enters through inlets 24b in channels 22b and exits through outlets 26b. FIG. 3A depicts one embodiment for implementing this concept.

In this embodiment, an inlet plenum 30 is provided within the heat sink for supplying the plurality of inlets 24a & 24b and an outlet plenum 34 is provided for receiving expelled cooling fluid from the channels though outlets 26a & 26b. In operation, cooling fluid enters inlet plenum 30 through at least one principal inlet 31 and flows down through inlets 24a & 24b to counter propagate through the channels of the heat sink and be expelled through outlets 26a & 26b into outlet plenum 34, where the heated coolant is removed through at least one principal outlet 35. Inlet plenum 30 is shown disposed within a first layer 32, while outlet plenum 34 resides within a second layer 36. If desired, layers 32 and 36 could comprise thermal insulation layers. Inlet plenum 30 could thus be thermally isolated from outlet plenum 34. Also, note that the outlet plenum is disposed away from the plurality of channels, with the inlet plenum disposed directly atop the plurality of channels.

As noted, curve B in FIG. 2 depicts the improved thermal characteristics of the heat sink of FIG. 3, i.e., compared with the conventional unidirectional flow of coolant represented by curve A. However, further enhancements to this basic counter flow (and uniform channel cross-section) embodiment are desired since the goal is to achieve an isothermal distribution across the heat sink.

Figure 4:
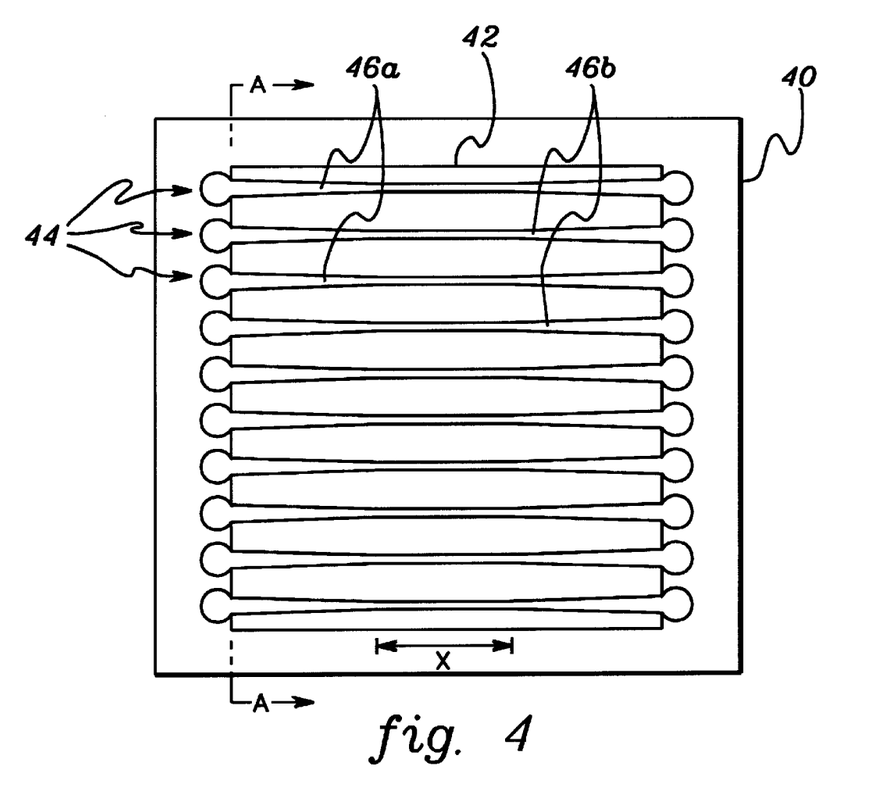
FIG. 4 is a plan view of another embodiment of a heat sink having a plurality of channels for carrying coolant flow in alternating directions, and wherein a cross-section of each channel tends to converge near a middle portion of the heat sink and diverge thereafter in accordance with the principles of the present invention.
Figure 4A:
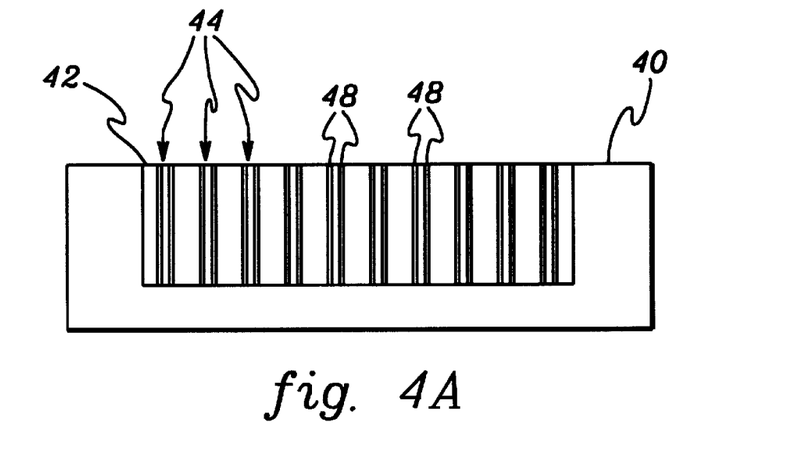
FIG. 4A is cross-sectional view of the heat sink embodiment of FIG. 4 taken along lines A—A.

This goal can be better achieved using an embodiment such as depicted in FIGS. 4 & 4A, wherein heat sink 40 is shown to have a cooling region 42 where multiple channels 44 are disposed substantially in parallel, with the coolant flow direction again being opposite in neighboring channels 46a & 46b, but with the fluid flow cross-section of each channel varying. The variations are such that the channels tend to converge to a minimum cross-section near a center portion X of the heat sink and diverge thereafter to a common cross-section at either side. Thus, in this one embodiment, the channels are equally wide at both ends but narrow to a predetermined minimum width in the center region. This structure is referred to herein as a converging, diverging channel. Through appropriate selection of the extent of convergence and divergence, thermal distribution curve C (FIG. 2) can be obtained, which shows the goal of an isothermal heat sink being more closely attained.

Before proceeding further, it should be noted that the concepts presented herein are equally applicable to evaporators, as well as to a broader class of cooling devices that can utilize single phase fluids (e.g., water) as well as two-phase coolants (e.g., refrigerants). The rationale for the converging, diverging channels is best understood if considered with reference to a single phase fluid.

Figure 1A:
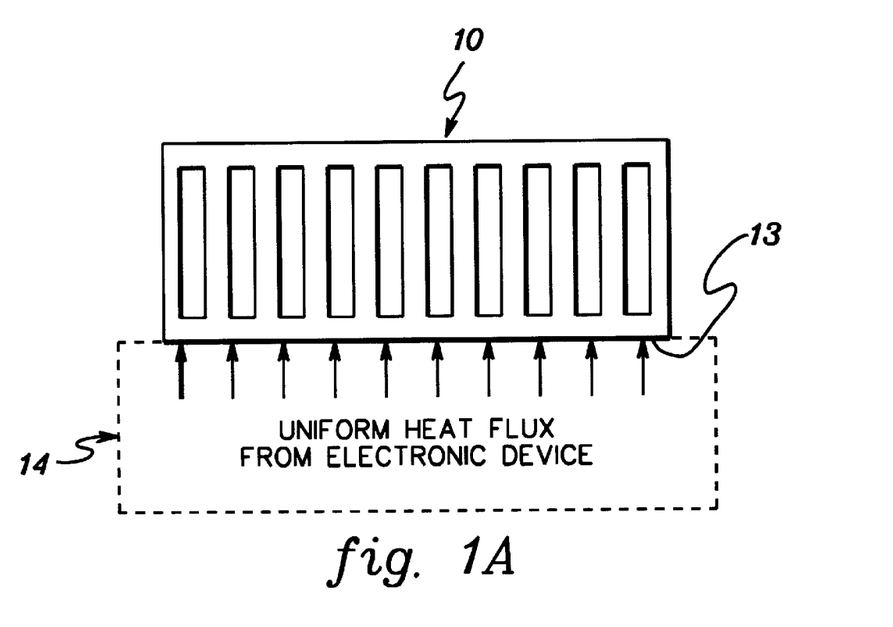
FIG. 1A depicts a side elevational view of the heat sink of FIG. 1, with uniform heat flux illustrated from an electronic device (shown in phantom)

To further summarize the above, consider the following qualitative example. Assume the existence of a cooling block with equally dimensioned (uniform) parallel channels that has a uniform heat flux applied to its bottom surface (FIG. 1A). If the cooling fluid is flowing through each channel in the same direction (parallel flow), the temperature profile of the bottom surface ($T_{surface}$) along with the channel axis would be represented by curve A in FIG. 2. Tsurface is proportional to the product of the heat transfer coefficient for the channel and the difference in temperature between the bottom surface temperature and the coolant. It is reasonable to assume fully developed laminar flow in the channels, so the heat transfer coefficient can be assumed constant along the length of the channel (from X=0 to X=L). But as the coolant flows down the channel, the coolant absorbs heat, and as a consequence, rises in temperature. The result is a bottom surface temperature that tracks the rise in coolant temperature.

Now reverse the flow direction in alternating channels, establishing the counter flow arrangement of FIG. 3. The resulting bottom surface temperature profile is denoted by curve B in FIG. 2. For a given channel section, both (relatively) low and high temperature coolant is experienced at both ends of the channel. They counteract one another which results in a more uniform temperature profile relative to the parallel flow case of curve A. However, $T_{surface}$ at the center of the channel is still noticeably warmer than at either end. Keep in mind that the channels in this situation are uniform which means that the heat transfer coefficient is constant along the length of the channel and temperature profile B is dictated by the coolant temperature distribution within the channels.

As a further enhancement, maintain the counter flow arrangement of FIG. 3, but modify the channel profile to the converging/diverging channels depicted in FIG. 4. This changing geometry significantly increases the heat transfer coefficient in the center of the channel. In fact, the heat transfer coefficient can be more than twice that at the ends depending on the ratio of channel width at the ends to that at the center. This will tend to pull down the bottom surface temperature in the center resulting in a more uniform (i.e., isothermal) temperature at the surface, thus further improving the overall performance of the device. The resultant profile is curve C in FIG. 2.

Formation of heat sink 40 (FIG. 4) can be realized by assembling the structure from individually shaped blocks that when assembled together, for example, by solder or braze, form the desired channels. FIG. 4A depicts a cross-sectional view of heat sink 40 taken along lines A—A of FIG. 4. The plurality of channels 44 are shown to include tapered restrictions 48 which achieve the desired convergence (to some minimal size opening) of the coolant flow cross-section through each channel near center portion X of the cooling region 42, followed by divergence thereof, for example, back to the original cross-sectional dimension. By way of example, the common channel width at either end of a channel might be approximately 1mm or greater, while the channel width might taper to 0.3 to 0.7 mm near the center portion of the cooling region.

Figure 5:
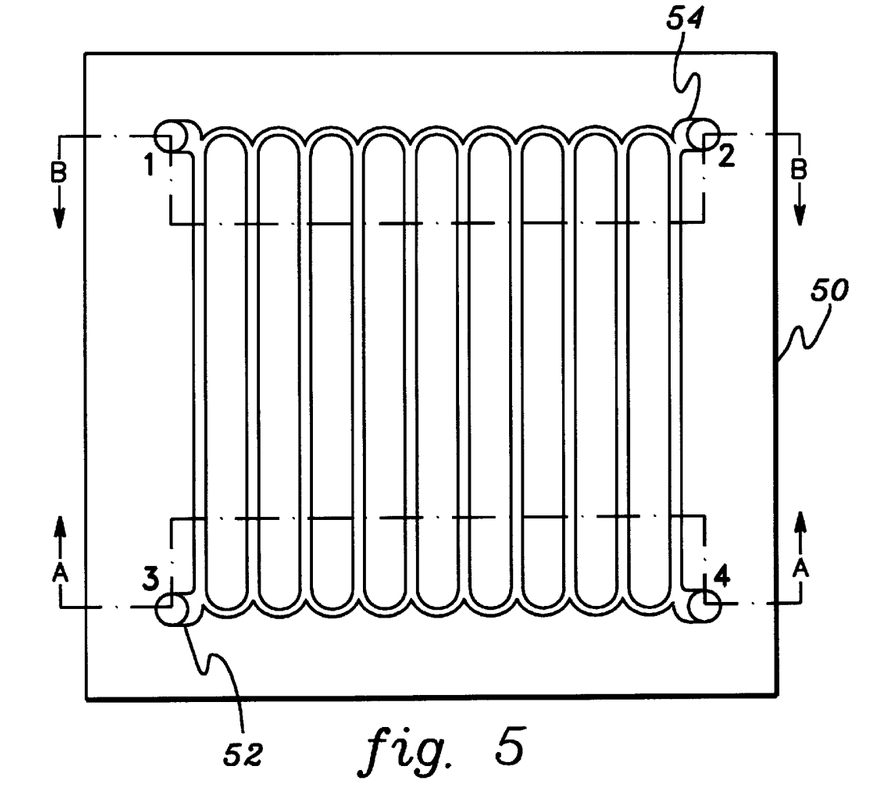
FIG. 5 is a plan view of another embodiment of a heat sink in accordance with the principles of the present invention wherein a first serpentine channel and a second serpentine channel are disposed one on top of the other such that the heat sink comprises a tiered structure.
Figure 5A:
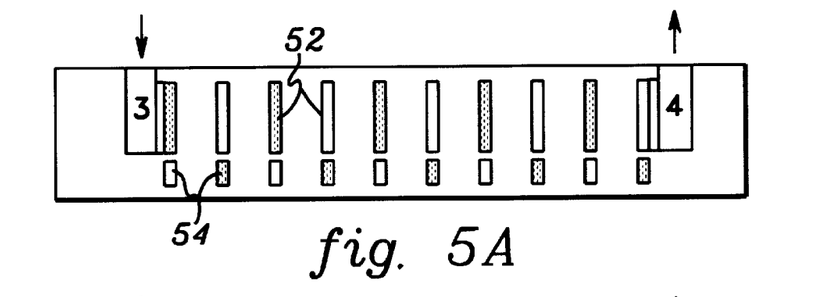
FIGS. 5A and 5B are cross-section views of the heat sink embodiment of FIG. 5 taken along lines A—A and B—B, respectively.
Figure 5B:
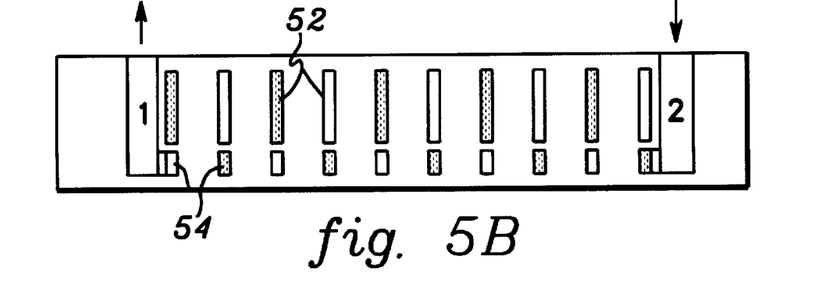

FIGS. 5, 5A & 5B depict an alternate heat sink 50 having an enhanced isothermal characteristic. In this approach, a tiered, serpentine counter flow arrangement is provided. Specifically, two independent flow channels 52 & 54 are stacked one atop the other as shown in FIGS. 5A & 5B. Coolant flow enters the lower tier channel 54 at inlet 2 and exits at outlet 1, while coolant flow enters the upper tier channel 52 at inlet 3 and exits at outlet 4.

When considering that heat that is transferred to heat sink 50 is conducted from the bottom surface up into the coolant flow within the channels, the arrangement of FIGS. 5, 5A & 5B results in the coldest fluid in the upper tier 52 being coupled with the warmest fluid in the lower tier 54, and vice versa. It is this coupling that results in this embodiment in a more uniform surface temperature at the bottom surface of the heat sink. Notice also that, for purposes of illustration, the geometry of the upper channel 52 is different from that of the lower channel 54. This can be done to optimize both heat transfer and temperature distribution. This tiered arrangement can be manufactured by a variety of techniques, including brazing or soldering subsections in a manner comparable to the method used to manufacture other cold plates in the art.

Before describing a further embodiment of an enhanced isothermal heat sink in accordance with the principles of the present invention, boundary layer development and the effect of slot-jets thereon are described below with reference to FIGS. 6A–7B.

As fluid flows over a surface or through a passage comprised of bounding surfaces, some of the fluid particles make contact with the surface and will assume zero velocity. These particles then act to retard the motion of particles in the adjoining fluid layer, which act to retard the motion of particles in the next adjoining fluid layer. At some distance from the surface this viscous effect becomes negligible, and the velocity of fluid particles further away from the wall(s) is unaffected by the presence of the wall. The region of flow which develops from the leading edge of the surface(s), and in which the effects of viscosity are felt, is called the boundary layer. An arbitrary point is used to designate the thickness of the boundary layer from the surface, and is usually chosen as the y coordinate at which the fluid velocity is 99% of the free-stream value.

Figure 6A:
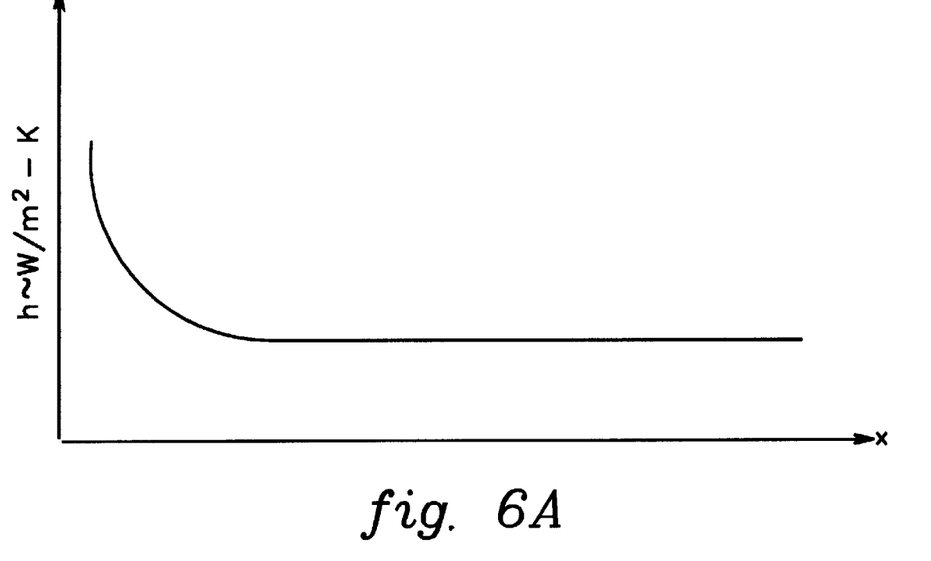
FIG. 6A is a graph of the heat transfer coefficient of fluid flow within a channel such as depicted in FIG. 6B.
Figure 6B:
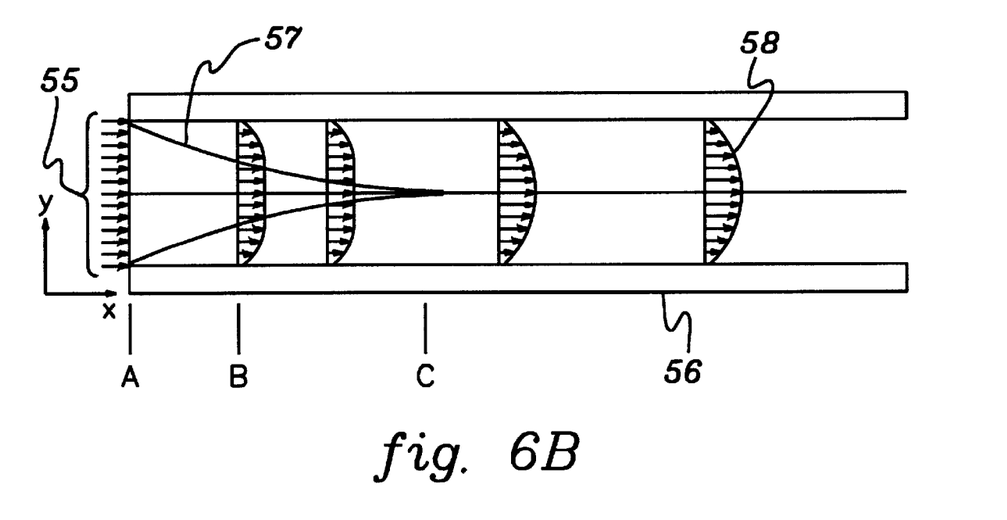
FIG. 6B is a plan view of a heat sink channel with fluid flow from left to right.

FIG. 6B provides a plan view looking down upon a cold-plate passage (defined by walls 56) with fluid flowing from left to right. Fluid enters the passage at position A with a uniform velocity profile 55 with respect to the y coordinate. Due to viscous effects a fluid boundary layer 57 begins to form, and as may be seen at position B downstream from the entrance, the fluid velocity varies from zero at the wall to 99% of the free-stream velocity at the edge of the boundary layer. As flow moves along the passage, the boundary layer continues to grow in thickness. As is shown, a boundary layer also forms along the opposing wall of the passage. Eventually, the two boundary layers will grow to the point at which they merge and totally occupy the passage as shown at point C. From this point on (x>C) there is no further change in the fluid velocity profile 58 as flow moves further along the passage, and the flow is termed fully developed. The flow region preceding the merging of the boundary layers (A<x<C) is termed the entrance region. Although discussing here the formation of a fluid or hydrodynamic boundary layer, if the surfaces are hotter than the fluid, a thermal boundary layer will form in an analogous manner. In this instance, the temperature of the fluid at the wall will be equal to the temperature at the surface and will decay in magnitude further away from the wall. At some point along the flow passage, the thermal boundary layers on the opposing walls will merge and totally occupy the passage. Downstream of this point the fluid temperature profile across the channel no longer changes.

The heat transfer coefficient or rate at which heat is transferred from the surface to the fluid per unit temperature difference is ultimately associated with the development of the hydrodynamic and thermal boundary layers in convective processes. In general, as the boundary layers get thicker the heat transfer coefficient decreases in magnitude. This is shown by the graph of FIG. 6A depicting the variation in the magnitude of the heat transfer coefficient, h, with distance, x, along the flow passage. The magnitude of h is very high near the flow entrance and decreases as flow moves down the passage and the boundary layers thicken. As the boundary layers merge at point C, the heat transfer coefficient reaches a constant value which remains the same throughout the fully developed region.

Figure 7A:
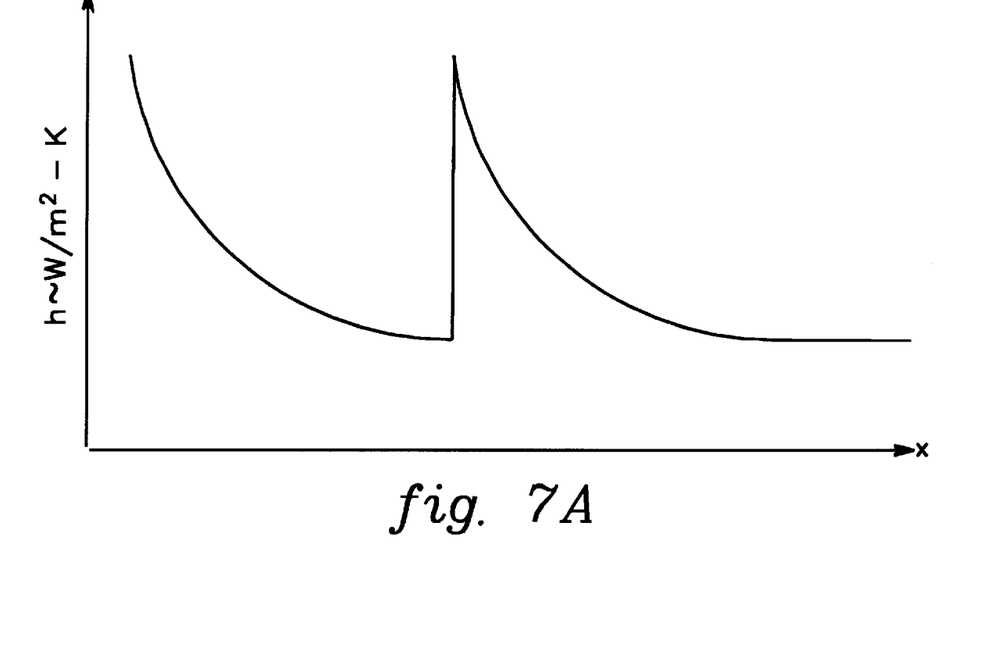
FIG. 7A is a graph of variation of a heat transfer coefficient versus channel position for fluid flow within the heat sink channel of FIG. 7B.
Figure 7B:
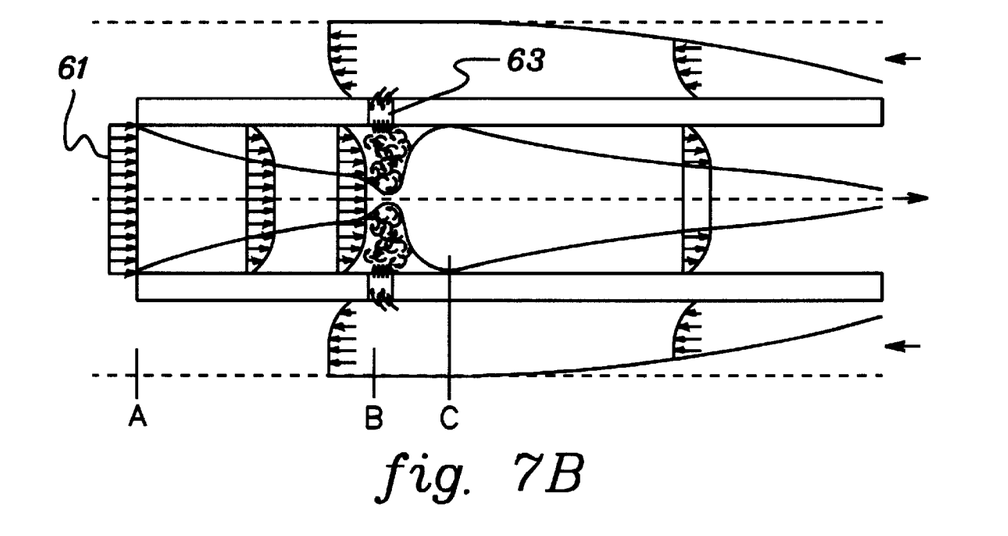
FIG. 7B illustrates the affects of cross-flow slots on fluid boundary layer development within a heat sink channel in accordance with the principles of the present invention.

FIGS. 7A & 7B illustrate the effects of cross-flow slots (as disclosed by FIGS. 8–9B) on fluid boundary layer development and the corresponding heat transfer coefficients. In FIG. 7B may be seen a fluid passage with the primary cooling flow moving from left-to-right beginning from an entrance velocity profile 61. Below and above this passage are shown one-half of the two adjacent flow passages with fluid flow moving right-to-left. The associated boundary layers are shown in each of the passages. In the center passage the initial development of the fluid boundary layer is depicted much the same as described above. However, slots are provided at point B connecting the center passage with the two adjacent passages which have fluid moving in the opposite direction. The higher pressure in the two adjacent channels will cause fluid to enter the slots from the higher pressure sides and exit into the lower pressure side (i.e., the center channel) as a slot jet 63 disrupting and breaking up the boundary layer at the wall. Further downstream, at point C, the flow is shown reattaching to the wall and beginning the development of a new boundary layer. As shown in FIG. 7A, illustrating the variation of h with the distance along the center flow passage, the heat transfer coefficient will be significantly higher at and immediately following the point where the flow reattaches to the channel surface and the new boundary layer begins. Thus, by distributing slot jets along the flow passage the average heat transfer coefficient acting over the total length of the flow passage is increased above the average value pertaining to the case without slot jets, thereby increasing the total heat transfer rate.

Figure 8:
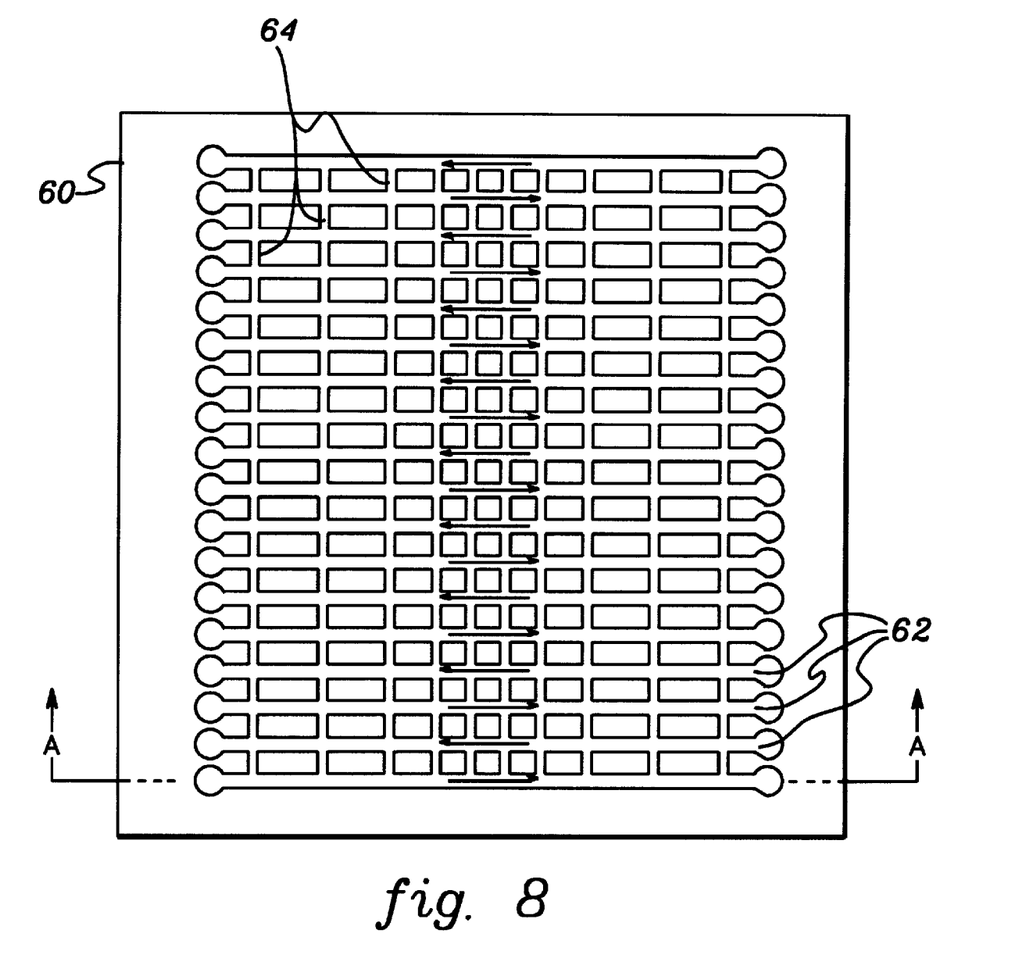
FIG. 8 is a plan view of a further embodiment of a heat sink in accordance with the principles of the present invention, wherein cross-flow openings are provided between adjacent primary flow channels to disrupt boundary layers formed within the primary flow channels.
Figure 8A:
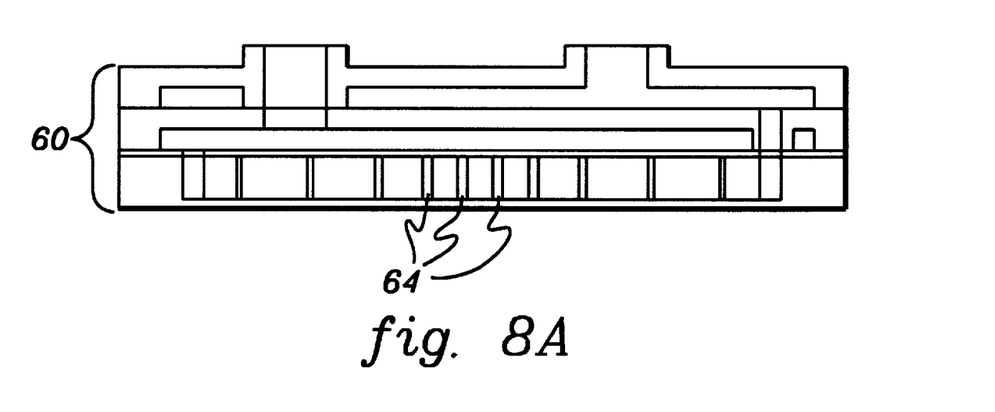
FIG. 8A is cross-sectional view of the heat sink of FIG. 8 taken along lines A—A.

FIGS. 8 & 8A depict one embodiment of an isothermal evaporator/cold head which employs slot jets in accordance with this aspect of the present invention. In this embodiment, an arrangement of parallel flow channels 62, also referred to herein as primary flow channels, is provided which is similar to those discussed above. Fluid flow within adjacent primary flow channels 62 is preferably counter propagating. The principle difference in this embodiment is the provision of cross-flow slots or openings 64 perpendicular to and connecting adjacent primary flow channels. Again, the purpose of slots 64 is to introduce flow jets normal to the fluid boundary layer formed along the walls of the primary flow channels.

As noted above, as fluid moves down a channel a boundary layer will grow on the two opposing walls and become thicker as flow moves along the channel. It is also known that the heat transfer coefficient produced by such flow is higher near the inlet of the channel where the boundary layer is thinner. Eventually, the two opposing boundary layers will grow to a point where they will merge and occupy the total width of the channel. At this point, the flow is fully developed and the heat transfer coefficient will remain constant along the remaining length of the channel. However, if the boundary layer can be disrupted or broken up at any point along the channel, it will begin to reform downstream of the disturbance. As in the initial development of the boundary layer, high heat transfer coefficients and consequently a greater rate of heat transfer will be experienced in those regions where the boundary layer is thinner. In the heat sink embodiment of FIGS. 8 & 8A, slot jets 64 are utilized to create the necessary localized disturbance to disrupt the boundary layers.

Figure 9A:
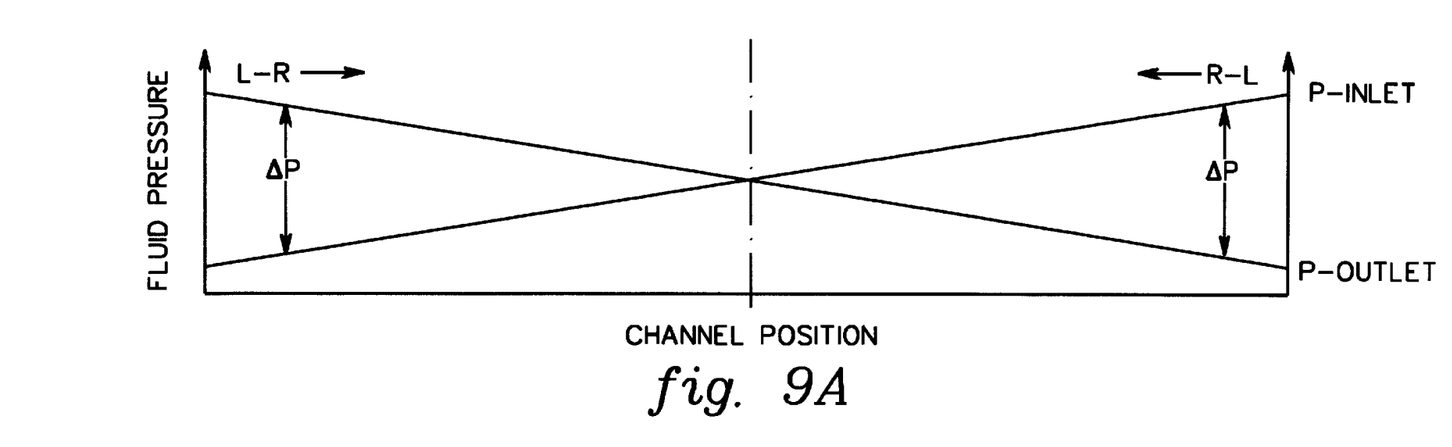
FIG. 9A is a graph of fluid pressure versus channel position as coolant fluid moves left to right and right to left within the channels of the heat sink of FIG. 8.
Figure 9B:
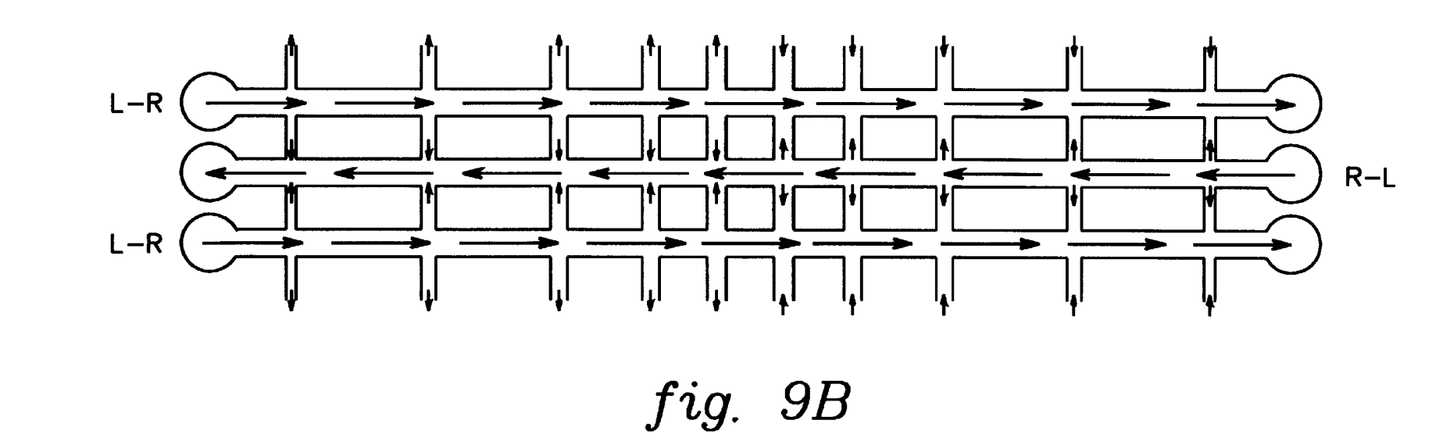
FIG. 9B is a partially enlarged portion of the heat sink of FIG. 8 correlated to the fluid pressure graph of FIG. 9A.

As shown in FIGS. 9A & 9B, not only will there be a fluid pressure gradient along each channel by virtue of the flow in that channel; but since the flow in adjacent channels is in opposite directions, there will also be a pressure difference between adjacent channels. This pressure difference will be greatest at the opposite ends of the channels and decrease literally to zero at the middle. By introducing slots connecting adjacent sets of channels, there will thus be fluid flow from the channel with the higher pressure at the axial position to the adjacent channel with the lower pressure.

For example, in FIGS. 9A & 9B, for a channel with fluid flowing in a left-to-right (L-R) direction, some fluid will flow out of the channel along the left half of the channel into the adjacent channels with flow in a right-to-left (R-L) direction. Conversely, in the right half of the channel fluid will flow into the channel from the two adjacent channels. The amount of fluid flowing through a slot may be controlled by the width of the slot, and in all cases the amount of cross-flow is maintained small (e.g., a few percent of the primary flow). It may be noted, that for purposes of illustration, the widths of the slots shown in FIGS. 8, 8A & 9B are disproportionately large compared with the width of the primary flow channels. Also, note that there is a greater density of cross flow openings 64 near the middle section of the heat sink. This is to provide greater heat transfer enhancement in this region and thereby counteract the tendency of the counter-flow scheme to result in higher temperatures in the middle than at the ends. It may also be noted that the relative widths of the slots may increase towards the middle of the channels to compensate for the reduced pressure differentials available to drive the slot jets in this region. For example, the width of the cross-flow slots might vary from 0.1 mm near either end of the primary flow channel to 0.2 mm near the center.

To summarize, those skilled in the art will understand from the above description that various embodiments of an isothermal heat sink are provided herein for use in cooling in an electronic device. Enhanced performance of the electronic device is thus attained by more uniformly dissipating heat across the thermal interface surface of the heat sink, thereby more uniformly cooling the electronic device and enhancing performance thereof.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. Apparatus for cooling an electronic device, comprising:
   a heat sink member with a surface for making thermal contact with said electronic device;
   wherein said heat sink member includes a plurality of channels for carrying coolant fluid, said plurality of channels comprising a first group of channels and a second group of channels, said first group of channels and said second group of channels being positioned generally alternately across the member so that coolant flow alternates direction across said member; and
   wherein at least one channel of said first group of channels and said second group of channels has a channel cross-section that varies over a length thereof to enhance a heat transfer coefficient of said coolant fluid within said at least one channel at a selected section of said at least one channel and thereby produce a more uniform temperature at said surface of said heat sink member when making thermal contact with said electronic device.

2. The apparatus of claim 1, wherein said at least one channel with varying cross-section has a fluid flow cross-section which decreases in a center portion of said heat sink member and increases thereafter so that coolant fluid flow through said at least one channel experiences an area of converging cross-section in said center portion of said member and thereafter an area of diverging cross-section.

3. The apparatus of claim 2, wherein said at least one channel of said first group of channels and said second group of channels comprises at least some channels of said first group of channels and said second group of channels.

4. The apparatus of claim 3, wherein said at least some channels comprise each channel of said first group of channels and said second group of channels.

5. The apparatus of claim 2, wherein said at least one channel has a channel width near its center in a range of 0.3 to 0.7 mm, and wherein said at least one channel has a common channel width at either end of approximately 1 mm or greater.

6. The apparatus of claim 1, wherein said at least one channel comprises an elongated channel having a first end and a second end, said at least one channel narrowing to a minimum fluid flow cross-section near a center thereof and having a common fluid flow cross-section at either end.

7. A fluid-cooled electronic apparatus, comprising:

an electronic device;

a heat sink member with a surface for making thermal contact with said electronic device;

wherein said heat sink member has a plurality of generally parallel channels for carrying coolant fluid, said plurality of channels comprising a first group of channels and a second group of channels, said first group of channels and said second group of channels being positioned generally alternately across the member so that coolant flow alternates direction across said member; and wherein at least one channel of said first group of channels and said second group of channels has a channel cross-section that varies over a length thereof to enhance a heat transfer coefficient of said coolant fluid within said at least one channel at a selected section of said at least one channel and thereby produce a more uniform temperature at said surface of said heat sink member when making thermal contact with said electronic device.

8. The fluid-cooled electronic apparatus of claim 7, wherein said at least one channel with varying cross-section has a fluid flow cross-section which decreases in a center portion of said heat sink member and increases thereafter so that coolant fluid flow through said at least one channel experiences an area of converging cross-section in said center portion of said member and thereafter an area of diverging cross-section.

9. The fluid-cooled electronic apparatus of claim 8, wherein said at least one channel of said first group of channels and said second group of channels comprises at least some channels of said first group of channels and said second group of channels.

10. The fluid-cooled electronic apparatus of claim 9, wherein said at least some channels comprise each channel of said first group of channels and said second group of channels.

11. The fluid-cooled electronic apparatus of claim 7, wherein said at least one channel has a channel width near its center in a range of 0.3 to 0.7 mm, and wherein said at least one channel has a common channel width at either end of approximately 1 mm or greater.

12. The fluid-cooled electronic apparatus of claim 7, wherein said at least one channel comprises an elongated channel having a first end and a second end, said at least one channel narrowing to a minimum fluid flow cross-section near a center thereof and having a common fluid flow cross-section at either end.

* * * * *